(12) United States Patent
Akiba et al.

(10) Patent No.: US 12,107,031 B2
(45) Date of Patent: Oct. 1, 2024

(54) THERMAL CONDUCTIVE SILICONE COMPOSITION AND SEMICONDUCTOR DEVICE

(71) Applicant: Shin-Etsu Chemical Co., Ltd., Tokyo (JP)

(72) Inventors: Shota Akiba, Annaka (JP); Kunihiro Yamada, Annaka (JP); Kenichi Tsuji, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 638 days.

(21) Appl. No.: 17/311,077

(22) PCT Filed: Nov. 27, 2019

(86) PCT No.: PCT/JP2019/046264
§ 371 (c)(1),
(2) Date: Jun. 4, 2021

(87) PCT Pub. No.: WO2020/129555
PCT Pub. Date: Jun. 25, 2020

(65) Prior Publication Data
US 2022/0044983 A1    Feb. 10, 2022

(30) Foreign Application Priority Data
Dec. 21, 2018    (JP) ................. 2018-238965

(51) Int. Cl.
*C08G 77/20*    (2006.01)
*C08K 3/08*    (2006.01)
(Continued)

(52) U.S. Cl.
CPC .......... *H01L 23/3737* (2013.01); *C08G 77/20* (2013.01); *C08K 3/08* (2013.01);
(Continued)

(58) Field of Classification Search
CPC ....... H01L 23/3737; C08G 77/20; C08K 3/08; C08K 2003/0806; C09K 5/063
(Continued)

(56) References Cited

U.S. PATENT DOCUMENTS 5,011,870 A    4/1991   Peterson
5,981,641 A    11/1999  Takahashi et al.
(Continued)

FOREIGN PATENT DOCUMENTS

CN    108603033 A    9/2018
EP    3 533 836 A1   9/2019
(Continued)

OTHER PUBLICATIONS

International Search Report, issued in PCT/JP2019/046264, dated Feb. 10, 2020.
(Continued)

*Primary Examiner* — Ori Nadav
(74) *Attorney, Agent, or Firm* — Birch, Stewart, Kolasch & Birch, LLP

(57) ABSTRACT

Provided are a thermal conductive silicone composition having a favorable heat dissipation property; and a semiconductor device using such composition. The thermal conductive silicone composition contains:

(A) an organopolysiloxane that has a kinetic viscosity of 10 to 100,000 mm²/s at 25° C., and is represented by the following average composition formula (1)

$$R^1_a SiO_{(4-a)/2} \qquad (1)$$

wherein $R^1$ represents a hydrogen atom, a saturated or unsaturated monovalent hydrocarbon group having 1 to 18 carbon atoms or a hydroxy group, and a represents a number satisfying $1.8 \leq a \leq 2.2$;

(B) a silver powder having a tap density of not lower than 3.0 g/cm³, a specific surface area of not larger than 2.0 m²/g and an aspect ratio of 1 to 30;

(Continued)

(C) an elemental gallium and/or gallium alloy having a melting point of 0 to 70° C. and being present at a mass ratio [Component (C)/{Component (B)+Component (C)}] of 0.001 to 0.1; and (D) a catalyst.

5 Claims, 1 Drawing Sheet

(51) Int. Cl.
    *C09K 5/06*     (2006.01)
    *H01L 23/373*     (2006.01)

(52) U.S. Cl.
    CPC ...... *C09K 5/063* (2013.01); *C08K 2003/0806* (2013.01); *C08K 2201/001* (2013.01); *C08K 2201/006* (2013.01)

(58) Field of Classification Search
    USPC .......................................................... 257/712
    See application file for complete search history.

(56) References Cited

U.S. PATENT DOCUMENTS

| | | | |
|---|---|---|---|
| 8,334,054 B2 * | 12/2012 | Endo | C09D 183/04 |
| | | | 525/476 |
| 10,752,775 B2 * | 8/2020 | Matsumoto | C08L 83/04 |
| 2002/0018885 A1 | 2/2002 | Takahashi et al. | |
| 2002/0099114 A1 | 7/2002 | Nakayoshi et al. | |
| 2004/0192834 A1 | 9/2004 | Nakayoshi et al. | |
| 2017/0096591 A1 | 4/2017 | Akiba et al. | |
| 2019/0002694 A1 | 1/2019 | Akiba et al. | |

FOREIGN PATENT DOCUMENTS

| | | | |
|---|---|---|---|
| JP | 2-153995 | A | 6/1990 |
| JP | 3-14873 | A | 1/1991 |
| JP | 10-110179 | A | 4/1998 |
| JP | 2000-63872 | A | 2/2000 |
| JP | 2000-63873 | A | 2/2000 |
| JP | 3130193 | B2 | 1/2001 |
| JP | 2002-30217 | A | 1/2002 |
| JP | 3677671 | B2 | 8/2005 |
| JP | 2008-222776 | A | 9/2008 |
| JP | 2013-10862 | A | 1/2013 |
| JP | 2017-66406 | A | 4/2017 |
| JP | 2018-58953 | A | 4/2018 |
| TW | 201800488 | A | 1/2018 |
| WO | WO 2016/056286 | A1 | 4/2016 |
| WO | WO 2017/159252 | A1 | 9/2017 |
| WO | WO 2018/079362 | A1 | 5/2018 |

OTHER PUBLICATIONS

Written Opinion of the International Searching Authority, issued in PCT/JP2019/046264, dated Feb. 10, 2020.

Taiwanese Office Action and Search Report for Taiwanese Application No. 108143378, dated Jun. 13, 2023, with an English translation.

Extended European Search Report issued Jul. 27, 2022, in European Patent Application No. 19900574.5.

Office Action issued Mar. 8, 2022, in Japanese Patent Application No. 2020-561245.

Chinese Office Action and Search Report for corresponding Chinese Application No. 201980084068.3, dated Nov. 1, 2023, with English transation.

* cited by examiner

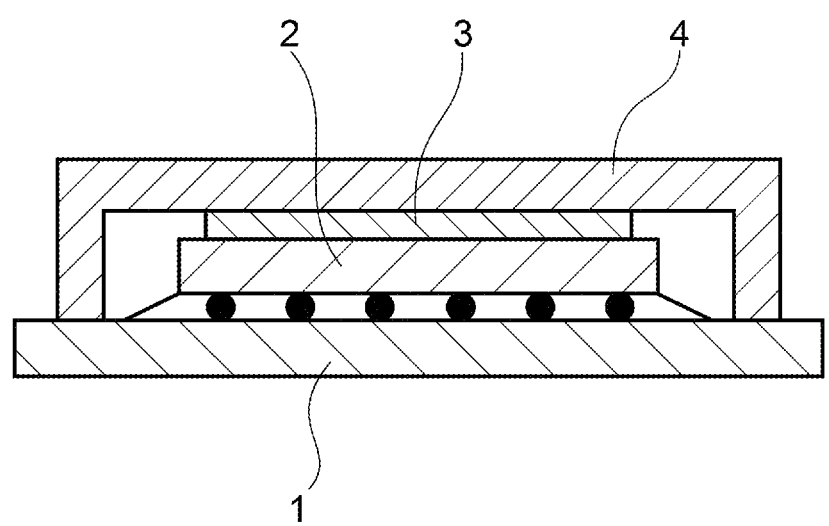

THERMAL CONDUCTIVE SILICONE COMPOSITION AND SEMICONDUCTOR DEVICE

TECHNICAL FIELD

The present invention relates to a silicone composition superior in thermal conductivity; and a semiconductor device.

BACKGROUND ART

Since most electronic parts generate heat during use, such heat has to be eliminated from an electronic part(s) to allow the electronic part to function properly. Especially, since integrated circuit elements such as a CPU used in a personal computer have exhibited a substantial increase in amount of heat generation due to higher operation frequencies, countermeasures against heat are now critical.

There have been proposed various methods for removing such heat. Particularly, with regard to electronic parts generating large amounts of heat, there has been proposed a method for dissipating the heat by interposing a thermal conductive material such as a thermal conductive grease or a thermal conductive sheet between an electronic part and a member such as a heatsink.

Patent document 1 discloses a silicone grease composition prepared by adding to a particular organopolysiloxane a spherical hexagonal aluminum nitride powder having a particle size within a given range. Patent document 2 discloses a thermal conductive silicone grease prepared by combining an aluminum nitride powder with a finer particle size and an aluminum nitride powder with a larger particle size. Patent document 3 discloses a thermal conductive silicone grease prepared by combining an aluminum nitride powder and a zinc oxide powder.

Patent document 4 discloses a thermal conductive grease composition employing an aluminum nitride powder surface-treated with organosilane.

The thermal conductivity of aluminum nitride is 70 to 270 W/mK. Diamond is known as a material having a thermal conductivity higher than that of aluminum nitride, and has a thermal conductivity of 900 to 2,000 W/mK. Patent document 5 discloses a thermal conductive silicone composition using diamond, zinc oxide and a dispersant with a silicone resin.

Further, Patent documents 6 and 7 disclose a thermal conductive grease composition prepared by mixing a base oil such as a silicone oil with a metallic aluminum powder.

Furthermore, Patent documents 8 and 9 disclose, for example, employing a silver powder with a high thermal conductivity as a filler.

However, none of the above thermal conductive materials and thermal conductive greases is capable of sufficiently dealing with the amount of heat generated by a recent integrated circuit element such as a CPU.

PRIOR ART DOCUMENTS

Patent Documents

Patent document 1: JP-A-Hei 2-153995
Patent document 2: JP-A-Hei 3-14873
Patent document 3: JP-A-Hei 10-110179
Patent document 4: JP-A 2000-63872
Patent document 5: JP-A 2002-30217
Patent document 6: JP-A 2000-63873
Patent document 7: JP-A 2008-222776
Patent document 8: Japanese Patent No. 3130193
Patent document 9: Japanese Patent No. 3677671

SUMMARY OF THE INVENTION

Problems to be Solved by the Invention

Therefore, it is an object of the present invention to provide a thermal conductive silicone composition having a favorable heat dissipation property; and a semiconductor device using such composition.

Means to Solve the Problems

The inventors of the present invention diligently conducted a series of studies to achieve the above objectives, and completed the invention as follows. That is, the inventors found that a thermal conductivity could be dramatically improved by mixing, into a particular organopolysiloxane, a silver powder having a particular tap density, aspect ratio and specific surface area; and an elemental gallium and/or gallium alloy having a low melting point. Specifically, the present invention is to provide the following thermal conductive silicone composition and others.

[1]
A thermal conductive silicone composition comprising:
(A) 100 parts by mass of an organopolysiloxane that has a kinetic viscosity of 10 to 100,000 mm$^2$/s at 25° C., and is represented by the following average composition formula (1)

$$R^1{}_a SiO_{(4-a)/2} \qquad (1)$$

wherein $R^1$ represents a hydrogen atom, a saturated or unsaturated monovalent hydrocarbon group having 1 to 18 carbon atoms or a hydroxy group, and a represents a number satisfying $1.8 \leq a \leq 2.2$;
(B) a silver powder having a tap density of not lower than 3.0 g/cm$^3$, a specific surface area of not larger than 2.0 m$^2$/g and an aspect ratio of 1 to 30, the component (B) being in an amount of 300 to 11,000 parts by mass per 100 parts by mass of the component (A);
(C) an elemental gallium and/or gallium alloy having a melting point of 0 to 70° C., the component (C) being in an amount of 1 to 1,200 parts by mass per 100 parts by mass of the component (A) and present at a mass ratio [Component (C)/{Component (B)+Component (C)}] of 0.001 to 0.1; and
(D) a catalyst selected from the group consisting of a platinum-based catalyst, an organic peroxide and a catalyst for condensation reaction, the component (D) being in a catalytic amount.

[2]
The thermal conductive silicone composition according to [1], wherein part of or the whole component (A) is:
an organopolysiloxane containing in one molecule at least two silicon atom-bonded alkenyl groups; and/or
an organohydrogenpolysiloxane containing in one molecule at least two silicon atom-bonded hydrogen atoms.

[3]
The thermal conductive silicone composition according to [1] or [2], further comprising:
(G) an organosilane that is in an amount of 0 to 20 parts by mass per 100 parts by mass of the component (A), and is represented by the following general formula (2)

$$R^2{}_b Si(OR^3)_{4-b} \qquad (2)$$

wherein $R^2$ represents a saturated or unsaturated monovalent hydrocarbon group that may have a substituent group(s), an epoxy group, an acryl group or a methacryl group; $R^3$ represents a monovalent hydrocarbon group; b satisfies $1 \leq b \leq 3$.

[4]

A semiconductor device comprising a heat-generating electronic part and a heat dissipator wherein the thermal conductive silicone composition according to any one of [1] to [3] is interposed between the heat-generating electronic part and the heat dissipator.

[5]

A method for manufacturing a semiconductor device, comprising a step of heating the thermal conductive silicone composition according to any one of [1] to [3] to 80° C. or higher with the thermal conductive silicone composition being sandwiched between a heat-generating electronic part and a heat dissipator, and with a pressure of 0.01 MPa or higher being applied thereto.

Effects of the Invention

Since the thermal conductive silicone composition of the present invention has a superior thermal conductivity, the composition is useful in a semiconductor device requiring a favorable heat dissipation effect.

BRIEF DESCRIPTION OF THE DRAWINGS

FIG. 1 is a vertical cross-sectional schematic diagram showing an example of a semiconductor device of the present invention.

MODE FOR CARRYING OUT THE INVENTION

The thermal conductive silicone composition of the present invention is described in detail hereunder.

Component (A)

An organopolysiloxane as a component (A) used in the thermal conductive silicone composition of the present invention is an organopolysiloxane represented by the following average composition formula (1), and having a kinetic viscosity of 10 to 100,000 mm²/s at 25° C.

(In the formula (1), $R^1$ represents a hydrogen atom, a hydroxy group, or a saturated or unsaturated monovalent hydrocarbon group having 1 to 18 carbon atoms. a satisfies $1.8 \leq a \leq 2.2$.)

In the formula (1), examples of the saturated or unsaturated monovalent hydrocarbon group having 1 to 18 carbon atoms, as represented by $R^1$, include alkyl groups such as a methyl group, an ethyl group, a propyl group, a hexyl group, an octyl group, a decyl group, a dodecyl group, a tetradecyl group, a hexadecyl group and an octadecyl group; cycloalkyl groups such as a cyclopentyl group and a cyclohexyl group; alkenyl groups such as a vinyl group and an allyl group; aryl groups such as a phenyl group and a tolyl group; aralkyl groups such as 2-phenylethyl group and 2-methyl-2-phenylethyl group; and halogenated hydrocarbon groups such as 3,3,3-trifluoropropyl group, 2-(perfluorobutyl)ethyl group, 2-(perfluorooctyl)ethyl group and p-chlorophenyl group. When the silicone composition of the invention is used as a grease, a is preferably in a range of 1.8 to 2.2, particularly preferably 1.9 to 2.1, in terms of consistency required for a silicone grease composition.

Further, as for the kinetic viscosity of the organopolysiloxane used in the present invention at 25° C., a composition will exhibit oil bleed easily when such kinetic viscosity is lower than 10 mm²/s; and a handling property of the composition will be impaired due to an increase in viscosity when such kinetic viscosity is higher than 100,000 mm²/s. Thus, it is required that this kinetic viscosity be 10 to 100,000 mm²/s, particularly preferably 30 to 10,000 mm²/s. Here, the kinetic viscosity of the organopolysiloxane refers to a value measured by an Ostwald viscometer at 25° C.

It is preferred that part of or the whole component (A) be:
an organopolysiloxane containing in one molecule at least two silicon atom-bonded alkenyl groups; and/or
an organohydrogenpolysiloxane containing in one molecule at least two silicon atom-bonded hydrogen atoms.

The organopolysiloxane containing in one molecule at least two silicon atom-bonded alkenyl groups, contains in one molecule on average about 2 or more (normally 2 to 50), preferably about 2 to 20, more preferably about 2 to 10 silicon atom-bonded alkenyl groups. Examples of the alkenyl groups in this organopolysiloxane include a vinyl group, an allyl group, a butenyl group, a pentenyl group, a hexenyl group and a heptenyl group, among which a vinyl group is particularly preferred. The alkenyl groups in this organopolysiloxane may be bonded to silicon atoms present at molecular chain terminals and/or silicon atoms present at moieties on the molecular chain other than the terminals.

In such organopolysiloxane containing in one molecule at least two silicon atom-bonded alkenyl groups, as organic groups other than the alkenyl groups that are capable of being bonded to silicon atoms, there can be listed, for example, alkyl groups such as a methyl group, an ethyl group, a propyl group, a butyl group, a pentyl group, a hexyl group and a heptyl group; aryl groups such as a phenyl group, a tolyl group, a xylyl group and a naphthyl group; aralkyl groups such as a benzyl group and a phenethyl group; and halogenated alkyl groups such as a chloromethyl group, 3-chloropropyl group and 3,3,3-trifluoropropyl group, among which a methyl group and a phenyl group are particularly preferred.

The molecule structure of such organopolysiloxane containing in one molecule at least two silicon atom-bonded alkenyl groups may, for example, be a linear structure, a partially branched linear structure, a cyclic structure, a branched structure and a three-dimensional network structure. Basically, as an organopolysiloxane having such molecule structure, preferred are a linear diorganopolysiloxane having a main chain composed of repeating diorganosiloxane units (D units), and having both of its molecular chain terminals blocked by triorganosiloxy groups; and a mixture of a linear diorganopolysiloxane and a branched or three-dimensional network organopolysiloxane.

The organohydrogenpolysiloxane containing in one molecule at least two silicon atom-bonded hydrogen atoms, has in one molecule at least 2 (normally about 2 to 300), preferably about 2 to 100 silicon atom-bonded hydrogen atoms (i.e. SiH groups). The molecule structure of such organohydrogenpolysiloxane may be any one of a linear structure, a branched structure, a cyclic structure or a three-dimensional network structure. The hydrogen atoms in such organohydrogenpolysiloxane may be bonded to silicon atoms present at molecular chain terminals and/or silicon atoms present at moieties on the molecular chain other than the terminals.

In the organohydrogenpolysiloxane containing in one molecule at least two silicon atom-bonded hydrogen atoms, as organic groups other than the hydrogen atoms that are capable of being bonded to silicon atoms, there can be listed, for example, alkyl groups such as a methyl group, an ethyl group, a propyl group, a butyl group, a pentyl group, a hexyl group and a heptyl group; aryl groups such as a phenyl group, a tolyl group, a xylyl group and a naphthyl group; aralkyl groups such as a benzyl group and a phenethyl group; and halogenated alkyl groups such as a chloromethyl group, 3-chloropropyl group and 3,3,3-trifluoropropyl group, among which a methyl group and a phenyl group are preferred.

It is preferred that the component (A) be contained in the composition of the present invention by an amount of 0.01 to 30% by mass.

Component B

A component (B) used in the thermal conductive silicone composition of the present invention is a silver powder having a tap density of not lower than 3.0 g/cm$^3$, a specific surface area of not larger than 2.0 m$^2$/g and an aspect ratio of 1 to 30.

When the tap density of the silver powder as the component (B) is lower than 3.0 g/cm$^3$, a filling rate of the component (B) in the composition cannot be raised such that the viscosity of the composition will increase, and that the handling property of the composition may be impaired accordingly. Therefore, the tap density of the silver powder as the component (B) is preferably in a range of 3.0 to 8.0 g/cm$^3$, more preferably 4.5 to 8.0 g/cm$^3$, even more preferably 5.5 to 8.0 g/cm$^3$.

Here, the tap density of the silver powder is a value obtained as follows. That is, 100 g of a silver powder is weighed out at first, and then gently dropped into a 100 ml graduated cylinder with the aid of a funnel. The graduated cylinder is then placed on a tap density measuring device to drop the silver powder 600 times at a dropping distance of 20 mm and a rate of 60 times/min. Later, the volume of the compacted silver powder is measured.

Further, when the specific surface area of the silver powder as the component (B) is larger than 2.0 m$^2$/g, the filling rate thereof in the composition cannot be raised such that the viscosity of the composition will increase, and that the handling property of the composition will be impaired accordingly. Thus, the specific surface area of the silver powder as the component (B) is preferably in a range of 0.08 to 2.0 m$^2$/g, more preferably 0.08 to 1.5 m$^2$/g, even more preferably 0.08 to 1.0 m$^2$/g.

Here, the specific surface area was calculated from a total surface area (m$^2$) and weight (g) of the silver powder as follows. At first, about 2 g of a silver powder was taken, and then degassed at 60±5° C. for 10 min, followed by using an automatic specific surface area measuring device (BET method) to measure a total surface area thereof. Later, the weight of the silver powder was measured, and the specific surface area was then calculated based on the following formula (4).

$$\text{Specific surface area (m}^2\text{/g)=Total surface area (m}^2\text{)/Weight of silver powder (g)} \quad (4)$$

The aspect ratio of the silver powder as the component (B) is in a range of 1 to 30, preferably 2 to 20, more preferably 3 to 15.

The aspect ratio refers to a ratio between a major axis and a minor axis of a particle (major axis/minor axis). A method for measuring the aspect ratio is such that, for example, an electron micrograph of particles is taken at first, followed by measuring the major and minor axes of the particles based on such electron micrograph, and then calculating the aspect ratio therefrom. The size of the particles can be measured based on an electron micrograph taken from above, and a larger diameter in such electron micrograph taken from above is measured as a major axis. With respect to such major axis, a minor axis thus corresponds to the thickness of a particle. The thickness of a particle cannot be measured based on an electron micrograph taken from above. The thickness of a particle may be measured as follows. That is, when taking an electron micrograph, a sample stage on which the particles have been mounted is to be installed in a tilted manner, followed by taking the electron micrograph from above, and then performing correction based on the tilt angle of the sample stage so as to calculate the particle thickness.

Specifically, after taking a few electron micrographs at a magnification ratio of several thousand times, the major and minor axes of any 100 silver particles were measured, followed by calculating the ratios between these major and minor axes (major axis/minor axis), and then obtaining an average value thereof as the aspect ratio.

Although there are no particular restrictions on the particle size of the silver powder as the component (B), it is preferred that an average particle size thereof be 0.2 to 30 µm, particularly preferably 1.0 to 20 µm.

The "average particle size" refers to a volume average diameter [MV] on volumetric basis that is measured by a laser diffraction-type particle size analyzer as follows. That is, before measurement, the silver powder is at first taken by one to two scoops with a microspatula and put into a 100 ml beaker, followed by putting about 60 ml of isopropyl alcohol thereinto, and then using an ultrasonic homogenizer to disperse the silver powder for a minute. Here, a measurement time was 30 seconds.

Although there are no particular restrictions on a method for producing the silver powder used in the thermal conductive silicone composition of the present invention, examples of such method include an electrolytic method, a crushing method, a heat treatment method, an atomizing method and a reduction method. The silver powder produced via the above method(s) may be used as it is; or crushed before use, provided that the aforementioned numerical value ranges are satisfied. If crushing the silver powder, there are no particular restrictions on a device for crushing the same. There can be used, for example, known devices such as a stamp mill, a ball mill, a vibrating mill, a hammer mill, a rolling roller and a mortar. Preferred are a stamp mill, a ball mill, a vibrating mill and a hammer mill.

The component (B) is added in an amount of 300 to 11,000 parts by mass per 100 parts by mass of the component (A). When the component (B) is in an amount of smaller than 300 parts by mass per 100 parts by mass of the component (A), the composition obtained will exhibit an impaired thermal conductivity; when the component (B) is in an amount of larger than 11,000 parts by mass per 100 parts by mass of the component (A), the composition will exhibit an impaired fluidity and a poor handling property thereby. It is preferred that the component (B) be added in an amount of 300 to 5,000 parts by mass, more preferably 500 to 5,000 parts by mass, per 100 parts by mass of the component (A).

Component (C)

A component (C) used in the thermal conductive silicone composition of the present invention is an elemental gallium and/or gallium alloy having a melting point of 0 to 70° C. The component (C) is a component added to impart a favorable thermal conductivity to a cured product obtained from the composition of the present invention. The component (C) used in the composition of the present invention forms interlinked thermal conductive paths by being fused with the component (B).

It is necessary that the melting point of the component (C) is in the range of 0 to 70° C. as described above. After preparing the composition of the present invention, in order to maintain a dispersed state of the components contained in the composition, it is required that the composition be kept in a low-temperature state of about −30 to −10° C., preferably −25 to −15° C. if the composition is to be stored for a long period of time or when the composition is being transported. Here, if the melting point is lower than 0° C., when the composition is being stored for a long period of time or transported as above, the component (C) will melt and thus liquefy in a way such that liquid fine particles generated will then agglutinate with one another more easily, and it will thus become difficult to maintain a state of the composition that is observed at the time of preparing the same. Further, if the melting point is greater than 70° C., the composition will exhibit a poor handling property as the component (C) does not melt quickly at the time of producing the composition. Therefore, as described above, the range of 0 to 70° C. is a required condition in terms of handling property of the composition, and is thus appropriate. It is particularly preferred that the melting point of the component (C) be in a range of 15 to 50° C.

The melting point of an elemental gallium is 29.8° C. Further, examples of typical gallium alloys include:
Gallium-indium alloy such as Ga—In (mass ratio=75.4:24.6, melting point=15.7° C.);
Gallium-tin alloy;
Gallium-tin-zinc alloy such as Ga—Sn—Zn (mass ratio=82:12:6, melting point=17° C.);
Gallium-indium-tin alloy such as Ga—In—Sn (mass ratio=21.5:16.0:62.5, melting point=10.7° C.);
Gallium-indium-bismuth-tin alloy such as Ga—In—Bi—Sn (mass ratio=9.4:47.3:24.7:18.6, melting point=48.0° C.)

One kind of such component (C) may be used alone, or two or more kinds thereof may be used in combination.

The liquid or solid fine particles of the elemental gallium and/or gallium alloy present in an uncured composition of the present invention have a substantially spherical shape(s), and may include those of irregular shapes. Further, an average particle size of the elemental gallium and/or gallium alloy is normally 0.1 to 100 μm, particularly preferably 5 to 70 μm. An extremely small average particle size will lead to an excessively high viscosity of the composition such that the composition will then exhibit a poor extensibility whereby a coating workability thereof shall be problematic; meanwhile, an extremely large average particle size will lead to an ununiform composition such that it will then be difficult to perform thin-film coating on a heat-generating electronic part or the like. Here, as described above, since the composition is to be stored under a low temperature immediately after its preparation, the shape and average particle size of the elemental gallium and/or gallium alloy as well as a dispersed state thereof in the composition can be maintained until performing coating on a heat-generating electronic part or the like.

The component (C) is added in an amount of 1 to 1,200 parts by mass, preferably 10 to 500 parts by mass, per 100 parts by mass of the component (A). This is because if the amount of the component (C) added is smaller than 1 part by mass, it will be difficult for the component (C) to fuse with the component (B) such that a desired thermal conductivity cannot be achieved; and if the amount of the component (C) added is larger than 1,200 parts by mass, the viscosity of the composition obtained will rise such that the handling property of the composition will deteriorate.

It is preferred that the mass ratio [Component (C)/{Component (B)+Component (C)}] be in a range of 0.001 to 0.1, more preferably 0.01 to 0.07. This is because if the mass ratio [Component (C)/{Component (B)+Component (C)}] is smaller than 0.001, it will be difficult for the elemental gallium and/or gallium alloy to fuse with the silver powder such that a desired thermal conductivity cannot be achieved; and if the mass ratio [Component (C)/{Component (B)+Component (C)}] is larger than 0.1, the cured product obtained after performing heating and curing will exhibit a high hardness such that there cannot be achieved a cured product with a high reliability.

Component (D)

A component (D) used in the thermal conductive silicone composition of the present invention is a catalyst selected from the group consisting of a platinum-based catalyst, an organic peroxide and a catalyst for condensation reaction. The composition of the present invention can be cured by adding such catalyst.

If the composition of the present invention is to be cured by hydrosilylation reaction, a platinum-based catalyst is added. There, the organohydrogenpolysiloxane containing in one molecule at least two silicon atom-bonded hydrogen atoms is preferably added in such an amount that the silicon atom-bonded hydrogen atoms in such organohydrogenpolysiloxane will be present in an amount of 0.1 to 15.0 mol, more preferably 0.1 to 10.0 mol, particularly preferably 0.1 to 5.0 mol, per 1 mol of the alkenyl groups in the organopolysiloxane containing in one molecule at least two silicon atom-bonded alkenyl groups.

Examples of a platinum-based catalyst include a chloroplatinic acid, an alcohol solution of chloroplatinic acid, an olefin complex of platinum, an alkenylsiloxane complex of platinum and a carbonyl complex of platinum.

In the composition of the present invention, the platinum-based catalyst is contained in an amount required for curing the composition of the invention i.e. the so-called catalytic amount. Specifically, the platinum-based catalyst is preferably contained in such an amount that the concentration of the platinum metal in this component will be 0.1 to 2,000 ppm in mass unit, particularly preferably 0.1 to 1,500 ppm in mass unit, with respect to the component (A).

Further, a catalyst for condensation reaction is not essential if using, as a curing agent, a silane having a hydrolyzable group(s) such as an aminoxy group, an amino group and a ketoxime group. Examples of such catalyst for condensation reaction include organic titanate esters such as tetrabutyl titanate and tetraisopropyl titanate; organic titanium chelate compounds such as diisopropoxybis(acetylacetate)titanium and diisopropoxybis(ethylacetoacetate)titanium; organic aluminum compounds such as aluminum tris(acetylacetonate) and aluminum tris(ethylacetoacetate); organic zirconium compounds such as zirconium tetra(acetylacetonate) and zirconium tetrabutylate; organic tin compounds such as dibutyltin dioctoate, dibutyltin dilaurate and butyltin-2-ethylhexoate; metallic salts of organic carboxylic acids, such as tin naphthenate, tin oleate, tin butylate, cobalt naphthenate and zinc stearate; amine compounds such as hexylamine and dodecylamine phosphate, and salts thereof; quaternary ammonium salts such as benzyltriethylammonium acetate; lower fatty acid salts of alkali metals, such as potassium acetate; dialkylhydroxylamines such as dimethylhydroxylamine and diethylhydroxylamine; and guanidyl group-containing organic silicon compounds such as tetramethylguanidylpropyltrimethoxysilane.

This catalyst for condensation reaction is contained in an amount required for curing the composition of the present invention i.e. the so-called catalytic amount. Specifically, the catalyst for condensation reaction is preferably added in an amount of 0.01 to 20 parts by mass, particularly preferably 0.1 to 10 parts by mass, per 100 parts by mass of the component (A).

Moreover, in order to control a curing speed of the composition of the present invention and improve the handling property thereof, a curing reaction inhibitor (component (I)) may be contained in the composition as an optional component. Examples of such curing reaction inhibitor include acetylene-based compounds such as 2-methyl-3-butyne-2-ol, 2-phenyl-3-butyne-2-ol and 1-ethynyl-1-cyclohexanol; ene-yne compounds such as 3-methyl-3-pentene-1-yne and 3,5-dimethyl-3-hexene-1-yne; and other compounds such as hydrazine-based compounds, phosphine-based compounds and mercaptan-based compounds. Although there are no particular restrictions on the amount of such curing reaction inhibitor contained, it is preferred that the curing reaction inhibitor be contained in an amount of 0.0001 to 1.0 parts by mass per 100 parts by mass of the component (A).

Meanwhile, if the composition of the present invention is to be cured by free radical reaction, an organic peroxide is preferred as a curing catalyst. Examples of such organic peroxide include benzoyl peroxide, di(p-methylbenzoyl)peroxide, di(o-methylbenzoyl)peroxide, dicumylperoxide, 2,5-dimethyl-2,5-bis(t-butylperoxy)hexane, di-t-butylperoxide, t-butylperoxide benzoate and 1,1-di(t-butylperoxy)cyclohexane. This organic peroxide is contained in an amount required for curing the composition of the present invention i.e. the so-called catalytic amount. Specifically, the organic peroxide is contained in an amount of 0.1 to 8 parts by mass per 100 parts by mass of the component (A).

Further, if the composition of the present invention is to be cured by condensation reaction, it is preferred that the composition contain, as a curing agent (component (J)), a silane or siloxane oligomer having in one molecule at least three silicon atom-bonded hydrolyzable groups; and as a curing catalyst, a catalyst for condensation reaction. Here, examples of the silicon atom-bonded hydrolyzable group include an alkoxy group, an alkoxyalkoxy group, an acyloxy group, a ketoxime group, an alkenoxy group, an amino group, an aminoxy group and an amide group. Further, other than the above hydrolyzable groups, a group(s) similar to those described above, such as a linear alkyl group, a branched alkyl group, a cyclic alkyl group, an alkenyl group, an aryl group, an aralkyl group and a halogenated alkyl group may also be bonded to the silicon atoms in such silane. Examples of such silane or siloxane oligomer include tetraethoxysilane, methyltriethoxysilane, vinyltriethoxysilane, methyltris(methylethylketoxime)silane, vinyltriacetoxysilane, ethylorthosilicate and vinyltri(isopropenoxy)silane.

This silane or siloxane oligomer is contained in an amount required for curing the composition of the present invention. Specifically, the silane or siloxane oligomer is preferably contained in an amount of 0.01 to 20 parts by mass, more preferably 0.1 to 10 parts by mass, per 100 parts by mass of the component (A).

Component (G)

Further, as a component (G) used in the thermal conductive silicone composition of the present invention, an organosilane represented by the following general formula (2) may be added.

$$R^2{}_b Si(OR^3)_{4-b} \quad (2)$$

(In the formula (2), $R^2$ represents a saturated or unsaturated monovalent hydrocarbon group that may have a substituent group(s), an epoxy group, an acryl group or a methacryl group. $R^3$ represents a monovalent hydrocarbon group. b satisfies $1 \leq b \leq 3$.)

Specific examples of $R^2$ in the general formula (2) include alkyl groups such as a methyl group, an ethyl group, a propyl group, a hexyl group, an octyl group, a nonyl group, a decyl group, a dodecyl group and a tetradecyl group; cycloalkyl groups such as a cycloalkylalkenyl group, an acryl group, an epoxy group, a cyclopentyl group and a cyclohexyl group; alkenyl groups such as a vinyl group and an allyl group; aryl groups such as a phenyl group and a tolyl group; aralkyl groups such as 2-phenylethyl group and 2-methyl-2-phenylethyl group; and halogenated hydrocarbon groups such as 3,3,3-trifluoropropyl group, 2-(perfluorobutyl)ethyl group, 2-(perfluorooctyl)ethyl group and p-chlorophenyl group. Examples of the substituent group(s) in the monovalent hydrocarbon group include an acryloyloxy group and a methacryloyloxy group. Further, b represents a number of 1 to 3. $R^3$ represents at least one alkyl group having 1 to 6 carbon atoms, such as a methyl group, an ethyl group, a propyl group, a butyl group, a pentyl group and a hexyl group, among which a methyl group and an ethyl group are particularly preferred.

Specific examples of the organosilane as the component (G) that is represented by the general formula (2), include the following compounds.

$C_{10}H_{21}Si(OCH_3)_3$
$C_{12}H_{25}Si(OCH_3)_3$
$C_{12}H_{25}Si(OC_2H_5)_3$
$C_{10}H_{21}Si(CH_3)(OCH_3)_2$
$C_{10}H_{21}Si(C_6H_5)(OCH_3)_2$
$C_{10}H_{21}Si(CH_3)(OC_2H_5)_2$
$C_{10}H_{21}Si(CH{=}CH_2)(OCH_3)_2$
$C_{10}H_{21}Si(CH_2CH_2CF_3)(OCH_3)_2$
$CH_2{=}C(CH_3)COOC_8H_{16}Si(OCH_3)_3$

If this organosilane is added to the composition of the present invention, it is preferably added in an amount of 0.1 to 20 parts by mass, more preferably 0.1 to 10 parts by mass, per 100 parts by mass of the component (A).

Component (H)

Further, together with the organopolysiloxane as the component (A) that is represented by the average composition formula (1), a hydrolyzable group-containing organopolysiloxane represented by the following general formula (3) may also be added to the thermal conductive silicone composition of the present invention. This hydrolyzable organopolysiloxane is preferably contained in an amount of 0 to 20% by mass, more preferably 0 to 10% by mass, with respect to the component (A).

[Chemical formula 1]

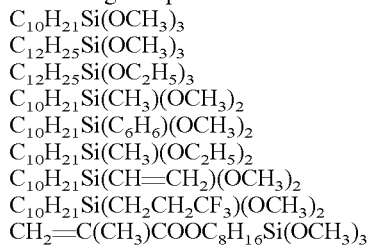

(3)

(In the formula (3), $R^4$ represents an alkyl group having 1 to 6 carbon atoms; each $R^5$ independently represents a saturated or unsaturated, substituted or unsubstituted monovalent hydrocarbon group having 1 to 18 carbon atoms; c represents a number of 5 to 120.)

The hydrolyzable organopolysiloxane represented by the formula (3) assists in highly filling a silicone composition with a powder. Further, the surface of a powder can also be hydrophobized by such hydrolyzable organopolysiloxane.

In the formula (3), $R^4$ represents an alkyl group having 1 to 6 carbon atoms. For example, there can be listed alkyl groups each having 1 to 6 carbon atoms, such as a methyl group, an ethyl group and a propyl group, among which a methyl group and an ethyl group are particularly preferred. Each $R^5$ independently represents a saturated or unsaturated, substituted or unsubstituted monovalent hydrocarbon group having 1 to 18, preferably 1 to 10 carbon atoms. Examples of such monovalent hydrocarbon group include alkyl groups such as a methyl group, an ethyl group, a propyl group, a hexyl group, an octyl group, a decyl group, a dodecyl group, a tetradecyl group, a hexadecyl group and an octadecyl group; cycloalkyl groups such as a cyclopentyl group and a cyclohexyl group; alkenyl groups such as a vinyl group and an allyl group; aryl groups such as a phenyl group and a tolyl group; aralkyl groups such as 2-phenylethyl group and 2-methyl-2-phenylethyl group; or groups obtained by substituting part of or all the hydrogen atoms in any of these groups with, for example, cyano groups and halogen atoms such as fluorine, bromine and chlorine atoms, the examples of such substituted groups being 3,3,3-trifluoropropyl group, 2-(perfluorobutyl)ethyl group, 2-(perfluorooctyl)ethyl group and p-chlorophenyl group. Among these examples, a methyl group is particularly preferred as $R^5$. In the formula (3), c represents an integer of 5 to 120, preferably an integer of 10 to 90.

Further, in addition to the components (A) to (H), the thermal conductive silicone composition of the present invention may also contain an inorganic compound powder and/or an organic compound material without impairing the effects of the present invention.

As such inorganic compound powder and organic compound material, those with high thermal conductivities are preferred. For example, there can be used at least one selected from an aluminum powder, a zinc oxide powder, a titanium oxide powder, a magnesium oxide powder, an alumina powder, an aluminum hydroxide powder, a boron nitride powder, an aluminumnitride powder, a diamond powder, a gold powder, a copper powder, a carbon powder, a nickel powder, an indium powder, a gallium powder, a metallic silicon powder, a silicon dioxide powder, carbon fiber, graphene, graphite, carbon nanotube and a carbon material.

If necessary, the surfaces of these inorganic compound powder and organic compound material may be hydrophobized with, for example, organosilane, organosilazane, organopolysiloxane and an organic fluorine compound. The average particle size of the inorganic compound powder and the organic compound material is preferably 0.5 to 100 μm, particularly preferably 1 to 50 μm. This is because either in a case where the average particle size is smaller than 0.5 μm or in a case where the average particle size is larger than 100 μm, a filling rate in the composition obtained will not rise. Further, the fiber length of a carbon fiber is preferably 10 to 500 μm, particularly preferably 30 to 300 m. This is because either in a case where the fiber length of carbon fiber is shorter than 10 μm or in a case where the fiber length of a carbon fiber is longer than 500 μm, a filling rate in the composition obtained will not rise. When a total amount of the inorganic compound powder and organic compound material added is larger than 3,000 parts by mass per 100 parts by mas of the component (A), the handling property of the composition will be impaired due to a poor fluidity thereof. Therefore, the total amount of the inorganic compound powder and organic compound material added is preferably 1 to 3,000 parts by mass, particularly preferably 5 to 2,000 parts by mass, per 100 parts by mass of the component (A).

The cured product of the thermal conductive silicone composition of the present invention can be obtained by performing heating at a temperature of not lower than 80° C. while applying a pressure of not lower than 0.01 MPa. Although there are no restrictions on the property of the cured product of the thermal conductive silicone composition of the present invention that is obtained in such manner, the cured product may be in a state of, for example, a gel, a rubber with a low hardness or a rubber with a high hardness.

The thermal conductive silicone composition of the present invention and the cured product thereof are suitable for use in heat dissipation materials.

Method for Producing Composition

The silicone composition of the present invention may be produced in accordance with a conventionally known method for producing a thermal conductive silicone composition, and there are no particular restrictions on such method. For example, the silicone composition of the present invention can be produced by mixing the above components (A) to (D) together with other components, if necessary, for 30 min to 4 hours, using a mixer such as Trimix™, Twin Mix™, Planetary Mixer™, Ultramixer™ and Hivis Disper Mix™. Further, mixing may be performed while performing heating at 50 to 150° C. as necessary.

The absolute viscosity of the thermal conductive silicone composition of the present invention measured at 25° C. is 10 to 600 Pa·s, preferably 15 to 500 Pa·s, more preferably 15 to 400 Pa·s. When the absolute viscosity is within the above ranges, a favorable grease can be provided, and the composition will exhibit a superior handling property as well. The above absolute viscosity can be achieved by regulating the amount of each component to the abovementioned amount(s). The absolute viscosity is a value measured using PC-1TL (10 rpm) manufactured by Malcom Co., Ltd.

Semiconductor Device

A semiconductor device of the present invention is such that the thermal conductive silicone composition of the invention is interposed between the surface of a heat-generating electronic part and a heat dissipator. It is preferred that the thermal conductive silicone composition of the invention interposed have a thickness of 10 to 200 μm.

Although a typical structure of the semiconductor device of the invention is shown in FIG. 1, the semiconductor device is not limited to that shown in FIG. 1. The thermal conductive silicone composition of the present invention is indicated by "3" in FIG. 1.

Method for Producing Semiconductor Device

A method for producing the semiconductor device of the present invention has a step of heating the thermal conductive silicone composition of the invention interposed between the heat-generating electronic part and the heat dissipator to 80° C. or higher with a pressure of not lower than 0.01 MPa being applied thereto. At that time, the pressure applied is preferably not lower than 0.01 MPa, more preferably 0.05 to 100 MPa, and even more preferably 0.1 MPa to 100 MPa. The temperature for heating needs to be 80° C. or higher. The temperature for heating is preferably 90 to 300° C., more preferably 100 to 300° C., and even more preferably 120 to 300° C.

The cured product of the thermal conductive silicone composition that is obtained after performing heating and curing preferably has a hardness of not higher than 90 in terms of shore D hardness.

Working Example

The present invention is described in greater detail hereunder with reference to working and comparative examples to further clarify the effects of the invention. However, the invention is not limited to these examples.

Component (A)
- A-1: Dimethylpolysiloxane with both ends blocked by dimethylvinylsilyl groups, and having a kinetic viscosity of 600 mm²/s at 25° C.
- A-2: Organohydrogenpolysiloxane represented by the following formula, and having a kinetic viscosity of 30 mm²/s at 25° C.

[Chemical formula 2]

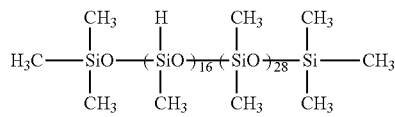

- A-3: Dimethylpolysiloxane with both ends blocked by hydroxyl groups, and having a kinetic viscosity of 5,000 mm²/s at 25° C.

Component (B)
- B-1: Silver powder having a tap density of 6.6 g/cm³, a specific surface area of 0.28 m²/g and an aspect ratio of 8
- B-2: Silver powder having a tap density of 6.2 g/cm³, a specific surface area of 0.48 m²/g and an aspect ratio of 13
- B-3: Silver powder having a tap density of 9.0 g/cm³, a specific surface area of 0.16 m²/g and an aspect ratio of 30
- B-4: Silver powder having a tap density of 3.0 g/cm³, a specific surface area of 2.0 m²/g and an aspect ratio of 20
- B-5 (Comparative example): Silver powder having a tap density of 2.3 g/cm³, a specific surface area of 2.3 m²/g and an aspect ratio of 1
- B-6 (Comparative example): Silver powder having a tap density of 3.3 g/cm³, a specific surface area of 2.11 m²/g and an aspect ratio of 1
- B-7 (Comparative example): Silver powder having a tap density of 2.8 g/cm³, a specific surface area of 1.8 m²/g and an aspect ratio of 2

Component (C)
- C-1: Elemental gallium (melting point=29.8° C.)
- C-2: Ga—In alloy (mass ratio=75.4:24.6, melting point=15.7° C.)
- C-3: Ga—In—Bi—Sn alloy (mass ratio=9.4:47.3:24.7: 18.6, melting point=48.0° C.)
- C-4 (Comparative example): Elemental indium (melting point=156.2° C.)

Component (D)
- D-1 (Platinum-based catalyst): A-1 solution of platinum-divinyltetramethyldisiloxane complex (containing 1 wt % of platinum atoms)
- D-2 (Organic peroxide): Peroxide (PERHEXA C by NOF CORPORATION)
- D-3 (Catalyst for condensation reaction): Tetramethylguanidylpropyltrimethoxysilane Component (G)
- G-1: Organosilane represented by the following formula

[Chemical formula 3]

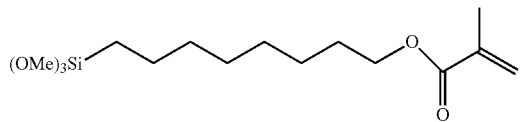

Component (H)
- H-1: Organopolysiloxane represented by the following formula

[Chemical formula 4]

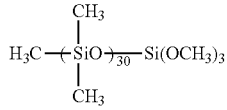

Component (I)
- I-1: 1-ethynyl-1-cyclohexanol

Component (J)
- J-1: Vinyltri(isopropenoxy)silane

Working Examples 1 to 14; and Comparative Examples 1 to 9

Compositions in working examples 1 to 14; and comparative examples 1 to 9 were obtained by mixing the given amounts of the components shown in Tables 1 to 3 as follows.

Specifically, the components (A), (G) and/or (H) were at first put into a 5 L planetary mixer (by INOUE MFG., INC.), followed by adding the components (B) and (C) thereto to perform mixing at 25° C. for 1.5 hours. Next, the components (D), (I) and/or (J) were added thereto so as to perform mixing until uniformly mixed.

Tests on the effects of the present invention were performed as follows.

[Viscosity]

The absolute viscosity of each composition was measured using a Malcom viscometer (type PC-1TL) at 25° C.

[Thermal Conductivity]

Each of the compositions obtained in the working examples 1 to 14 and comparative examples 1 to 9 was poured into a mold having a thickness of 6 mm, followed by performing heating at 150° C. for 1.5 hours while applying a pressure of 0.35 MPa thereto, thus obtaining a cured product. The thermal conductivity of each cured product was then measured by TPS-2500S manufactured by Kyoto Electronics Manufacturing Co., Ltd. at 25° C. As for the working example 14, the composition was poured into a mold having a thickness of 6 mm, and then left at 23±2° C./50±5% RH for seven days before performing measurement using TPS-2500S manufactured by Kyoto Electronics Manufacturing Co., Ltd.

[Hardness]

Each of the compositions obtained in the working examples 1 to 14 and comparative examples 1 to 9 was poured into a mold having a thickness of 6 mm, followed by performing heating at 150° C. for 1.5 hours while applying a pressure of 0.35 MPa thereto, thus obtaining a cured product. The hardness of such cured product was then measured by an automatic hardness tester DigiTest II as a shore D hardness tester manufactured by H. Bareiss USA, Inc.

TABLE 1

Unit: part by mass

| | Working example | | | | | | |
|---|---|---|---|---|---|---|---|
| | 1 | 2 | 3 | 4 | 5 | 6 | 7 |
| A-1 | 95 | 95 | 95 | 95 | 95 | 95 | 95 |
| A-2 | 5 | 5 | 5 | 5 | 5 | 5 | 5 |
| A-3 | | | | | | | |
| B-1 | 600 | 4,800 | 4,800 | 4,800 | 4,800 | 950 | 950 |
| B-2 | | | | | | | |
| B-3 | | | | | | | |
| B-4 | | | | | | | |
| B-5 | | | | | | | |
| B-6 | | | | | | | |
| B-7 | | | | | | | |
| C-1 | 20 | 150 | 460 | 460 | 460 | | |
| C-2 | | | | | | 20 | |
| C-3 | | | | | | | 20 |
| C-4 | | | | | | | |
| C/(B + C) | 0.03 | 0.03 | 0.09 | 0.09 | 0.09 | 0.02 | 0.02 |
| D-1 | 6.73 | 6.73 | 6.73 | 6.73 | 6.73 | 6.73 | 6.73 |
| D-2 | | | | | | | |
| D-3 | | | | | | | |
| G-1 | | | | 10 | | | |
| H-1 | | | | | 10 | | |
| I-1 | 0.17 | 0.17 | 0.17 | 0.17 | 0.17 | 0.17 | 0.17 |
| J-1 | | | | | | | |
| Viscosity (Pa · s) | 18 | 353 | 380 | 375 | 370 | 18 | 22 |
| Thermal conductivity (W/mK) | 18 | 86 | 93 | 88 | 85 | 20 | 27 |
| Hardness (Shore D) | 63 | 75 | 80 | 79 | 78 | 68 | 65 |

TABLE 2

Unit: part by mass

| | Working example | | | | | | |
|---|---|---|---|---|---|---|---|
| | 8 | 9 | 10 | 11 | 12 | 13 | 14 |
| A-1 | 95 | 95 | 95 | 95 | 95 | 95 | |
| A-2 | 5 | 5 | 5 | 5 | 5 | 5 | |
| A-3 | | | | | | | 100 |
| B-1 | 950 | | | | | | 950 |
| B-2 | | 950 | | | 11,000 | 11,000 | |
| B-3 | | | 950 | | | | |
| B-4 | | | | 950 | | | |
| B-5 | | | | | | | |
| B-6 | | | | | | | |
| B-7 | | | | | | | |
| C-1 | 20 | 20 | 20 | 20 | 11 | 1,080 | 20 |
| C-2 | | | | | | | |
| C-3 | | | | | | | |
| C-4 | | | | | | | |
| C/(B + C) | 0.02 | 0.02 | 0.02 | 0.02 | 0.001 | 0.09 | 0.02 |
| D-1 | | | | | | | |
| D-2 | 6 | 6 | 6 | 6 | 6 | 6 | |
| D-3 | | | | | | | 7 |
| G-1 | | | | | | | |
| H-1 | | | | | | | |
| I-1 | | | | | | | |
| J-1 | | | | | | | 1 |
| Viscosity (Pa · s) | 18 | 36 | 15 | 90 | 570 | 597 | 28 |
| Thermal conductivity (W/mK) | 20 | 23 | 28 | 20 | 92 | 95 | 27 |
| Hardness (Shore D) | 60 | 62 | 70 | 68 | 85 | 88 | 70 |

TABLE 3

Unit: part by mass

| | Comparative example | | | | | | | | |
|---|---|---|---|---|---|---|---|---|---|
| | 1 | 2 | 3 | 4 | 5 | 6 | 7 | 8 | 9 |
| A-1 | 95 | 95 | 95 | 95 | 95 | 95 | 95 | 95 | 95 |
| A-2 | 5 | 5 | 5 | 5 | 5 | 5 | 5 | 5 | 5 |
| A-3 | | | | | | | | | |
| B-1 | 280 | 12,000 | 950 | 600 | 600 | | | | |
| B-2 | | | | | | | | | |
| B-3 | | | | | | 11,000 | | | |
| B-4 | | | | | | | | | |
| B-5 | | | | | | | 950 | | |
| B-6 | | | | | | | | 950 | |
| B-7 | | | | | | | | | 950 |
| C-1 | 20 | 500 | | 0.5 | | 1,350 | 20 | 20 | 20 |
| C-2 | | | | | | | | | |
| C-3 | | | | | | | | | |
| C-4 | | | 60 | | | | | | |
| C/(B + C) | 0.07 | 0.04 | | 0.0008 | 0 | 0.11 | 0.02 | 0.02 | 0.02 |
| D-1 | 6.73 | 6.73 | 6.73 | 6.73 | 6.73 | 6.73 | 6.73 | 6.73 | 6.73 |
| D-2 | | | | | | | | | |
| D-3 | | | | | | | | | |
| G-1 | | | | | | | | | |
| H-1 | | | | | | | | | |
| I-1 | 0.17 | 0.17 | 0.17 | 0.17 | 0.17 | 0.17 | 0.17 | 0.17 | 0.17 |
| J-1 | | | | | | | | | |
| Viscosity (Pa · s) | 8 | Failed to form | Failed to form | 16 | 16 | 600 | 685 | 653 | 660 |

TABLE 3-continued

Unit: part by mass

| | Comparative example | | | | | | | | |
|---|---|---|---|---|---|---|---|---|---|
| | 1 | 2 | 3 | 4 | 5 | 6 | 7 | 8 | 9 |
| Thermal conductivity (W/mK) | 2 | paste-like matter | paste-like matter | 6 | 5 | 95 | 5 | 6 | 6 |
| Hardness (Shore D) | 20 | | | 20 | 20 | >95 | 40 | 40 | 45 |

DESCRIPTION OF THE SYMBOLS

1. Substrate
2. Heat-generating electronic part (CPU)
3. Thermal conductive silicone composition layer
4. Heat dissipator (Lid)

The invention claimed is:

1. A thermal conductive silicone composition comprising:
   (A) 100 parts by mass of an organopolysiloxane that has a kinetic viscosity of 10 to 100,000 mm²/s at 25° C., and is represented by the following average composition formula (1)

$$R^1_a SiO_{(4-a)/2} \quad (1)$$

wherein $R^1$ represents a hydrogen atom, a saturated or unsaturated monovalent hydrocarbon group having 1 to 18 carbon atoms or a hydroxy group, and a represents a number satisfying $1.8 \leq a \leq 2.2$;
   (B) a silver powder having a tap density of not lower than 3.0 g/cm³, a specific surface area of not larger than 2.0 m²/g and an aspect ratio of 8 to 30, the component (B) being in an amount of 300 to 11,000 parts by mass per 100 parts by mass of the component (A);
   (C) an elemental gallium and/or gallium alloy having a melting point of 0 to 70° C., the component (C) being in an amount of 1 to 1,200 parts by mass per 100 parts by mass of the component (A) and present at a mass ratio [Component (C)/{Component (B)+Component (C)}] of 0.001 to 0.09; and
   (D) a catalyst selected from the group consisting of a platinum-based catalyst, an organic peroxide and a catalyst for condensation reaction, the component (D) being in a catalytic amount.

2. The thermal conductive silicone composition according to claim 1, wherein part of or the whole component (A) is:
   an organopolysiloxane containing in one molecule at least two silicon atom-bonded alkenyl groups; and/or
   an organohydrogenpolysiloxane containing in one molecule at least two silicon atom-bonded hydrogen atoms.

3. The thermal conductive silicone composition according to claim 1, further comprising:
   (G) an organosilane that is in an amount of 0 to 20 parts by mass per 100 parts by mass of the component (A), and is represented by the following general formula (2)

$$R^2_b Si(OR^3)_{4-b} \quad (2)$$

wherein $R^2$ represents a saturated or unsaturated monovalent hydrocarbon group that may have a substituent group(s), an epoxy group, an acryl group or a methacryl group; $R^3$ represents a monovalent hydrocarbon group; b satisfies $1 \leq b \leq 3$.

4. A semiconductor device comprising a heat-generating electronic part and a heat dissipator wherein the thermal conductive silicone composition according to claim 1 is interposed between the heat-generating electronic part and the heat dissipator.

5. A method for manufacturing a semiconductor device, comprising a step of heating the thermal conductive silicone composition according to claim 1 to 80° C. or higher with the thermal conductive silicone composition being sandwiched between a heat-generating electronic part and a heat dissipator, and with a pressure of 0.01 MPa or higher being applied thereto.

* * * * *